(12) United States Patent
Kim

(10) Patent No.: US 8,748,257 B2
(45) Date of Patent: Jun. 10, 2014

(54) SEMICONDUCTOR DEVICES AND METHODS OF MANUFACTURE THEREOF

(75) Inventor: Sun-Oo Kim, Hopewell Junction, NY (US)

(73) Assignee: Infineon Technologies AG, Neubiberg (DE)

( * ) Notice: Subject to any disclaimer, the term of this patent is extended or adjusted under 35 U.S.C. 154(b) by 345 days.

(21) Appl. No.: 13/100,770

(22) Filed: May 4, 2011

(65) Prior Publication Data

US 2012/0282753 A1    Nov. 8, 2012

Related U.S. Application Data

(62) Division of application No. 12/059,457, filed on Mar. 31, 2008, now Pat. No. 7,960,811.

(51) Int. Cl.
*H01L 21/8242* (2006.01)

(52) U.S. Cl.
USPC ..... 438/239; 438/253; 438/396; 257/E21.648

(58) Field of Classification Search
CPC .. H01L 28/40; H01L 27/0733; H01L 27/0805
USPC .......... 257/306–308, 773, E21.008, E21.015, 257/E21.648; 438/393, 396, 622, 666, 668, 438/239, 253, 957
See application file for complete search history.

(56) References Cited

U.S. PATENT DOCUMENTS

| | | | |
|---|---|---|---|
| 8,022,458 B2* | 9/2011 | Chang et al. | 257/307 |
| 2006/0024905 A1* | 2/2006 | He et al. | 438/396 |
| 2007/0181924 A1* | 8/2007 | Baumgartner et al. | 257/296 |
| 2007/0217122 A1 | 9/2007 | Gevorgian et al. | |
| 2009/0009926 A1* | 1/2009 | Baumgartner et al. | 361/303 |
| 2009/0141424 A1* | 6/2009 | Barth et al. | 361/311 |
| 2009/0243036 A1* | 10/2009 | Kim | 257/532 |

FOREIGN PATENT DOCUMENTS

WO    WO 2005/062355 A1    7/2005

* cited by examiner

*Primary Examiner* — Hoai V Pham
(74) *Attorney, Agent, or Firm* — Slater & Matsil, L.L.P.

(57) ABSTRACT

Capacitor plates, capacitors, semiconductor devices, and methods of manufacture thereof are disclosed. In one embodiment, a capacitor plate includes at least one via and at least one conductive member coupled to the at least one via. The at least one conductive member comprises an enlarged region proximate the at least one via.

20 Claims, 5 Drawing Sheets

SEMICONDUCTOR DEVICES AND METHODS OF MANUFACTURE THEREOF

This application is a divisional of U.S. application Ser. No. 12/059,457, filed on Mar. 31, 2008, entitled "Semiconductor Devices and Methods of Manufacture Thereof" and issued as U.S. Pat. No. 7,960,811, which application is hereby incorporated herein by reference.

TECHNICAL FIELD

The present invention relates generally to the fabrication of semiconductor devices, and more particularly to the fabrication of capacitors.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

Capacitors are elements that are used extensively in semiconductor devices for storing an electrical charge. Capacitors essentially comprise two conductive plates separated by an insulating material. When an electric current is applied to a capacitor, electric charges of equal magnitude yet opposite polarity build up on the capacitor plates. The capacitance, or the amount of charge held by the capacitor per applied voltage, depends on a number of parameters, such as the area of the plates, the distance between the plates, and the dielectric constant value of the insulating material between the plates, as examples. Capacitors are used in applications such as electronic filters, analog-to-digital converters, memory devices, control applications, and many other types of semiconductor device applications.

What are needed in the art are improved methods of fabricating capacitors in semiconductor devices and structures thereof.

SUMMARY OF THE INVENTION

Technical advantages are generally achieved by embodiments of the present invention, which provide novel methods of manufacturing capacitor plates, capacitors, semiconductor devices, and structures thereof.

In accordance with an embodiment of the present invention, a capacitor plate includes at least one via and at least one conductive member coupled to the at least one via. The at least one conductive member comprises an enlarged region proximate the at least one via.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments of the invention and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in specific contexts, namely implemented in CMOS device applications. Embodiments of the invention may also be implemented in other semiconductor applications such as memory devices, logic devices, power devices, and other applications that utilize capacitors, for example.

Capacitors may be formed in conductive material layers of semiconductor devices. Metal-insulator-metal (MIM) capacitors are formed by positioning horizontal plates parallel to one another, for example. Vertical parallel plate (VPP) capacitors are formed by positioning vertical plates parallel to one another in multiple conductive material layers. However, vias of VPP capacitors may not land exactly where they are intended to land on other portions of the capacitor plates. As fabricated, the vias may be larger at the top than at the bottom, resulting in the larger top portions of the vias being placed closer to other capacitor plates than intended, resulting in shorts, device failures, or poor time dependent dielectric breakdown (TDDB) measurements due to the undesirably close spacing between capacitor plates near the vias. Vias may not land on underlying capacitor plate portions, and the manufacturing process may be sensitive to process performance of the overlay and critical dimension (CD) variances. Furthermore, capacitance is reduced due to the larger via shapes.

Thus, what are needed in the art are improved methods of manufacturing capacitor plates and capacitors in semiconductor devices.

These and other problems are generally solved or circumvented, and technical advantages are generally achieved, by embodiments of the present invention, which comprise capacitors that are formed in multiple conductive layers of semiconductor devices. The capacitor plates of the capacitors have a novel shape, comprising conductive members that have enlarged regions proximate vias of the capacitor plates, ensuring landing of the vias on the conductive members and providing a rugged capacitor design, to be described further herein. The conductive members are locally enlarged proximate the vias, yet are not enlarged in regions of the conductive members that are not proximate the vias. The enlarged regions of the conductive members make contact fully with the vias and maximize performance of capacitors formed from the capacitor plates.

Figure 1:
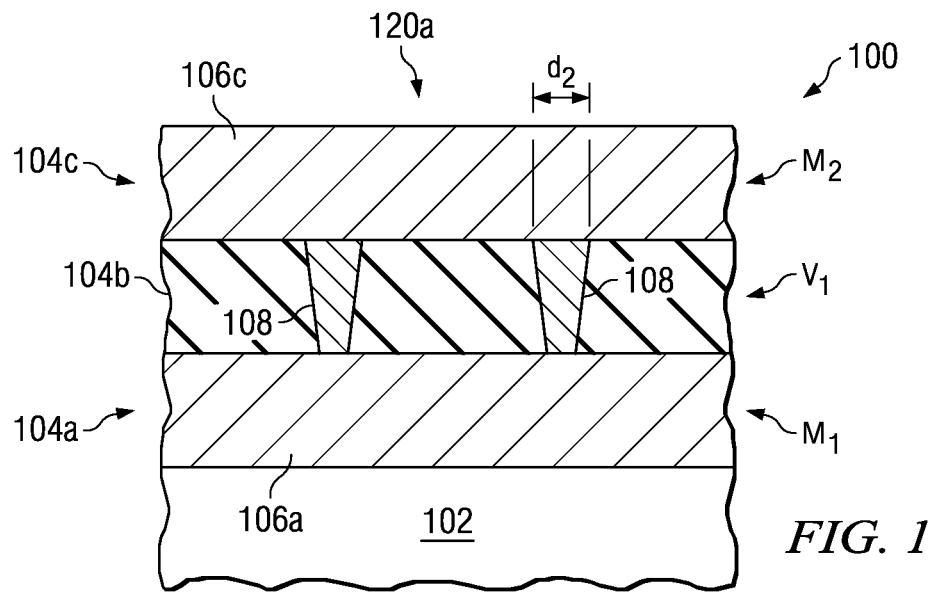
FIG. 1 shows a cross-sectional view of a semiconductor device in accordance with an embodiment of the present invention, wherein a capacitor plate is formed in a plurality of conductive material layers of the semiconductor device.

FIG. 1 shows a cross-sectional view of a semiconductor device 100 in accordance with an embodiment of the present invention, wherein a capacitor plate 120a (and also capacitor plate 120b shown in a top view in FIG. 2) of a capacitor is formed in a plurality of conductive layers $M_1$, $V_1$, and $M_2$ of the semiconductor device 100. To manufacture the semiconductor device 100, first, a workpiece 102 is provided. The workpiece 102 may include a semiconductor substrate comprising silicon or other semiconductor materials and may be covered by an insulating layer, for example. The workpiece 102 may also include other active components or circuits formed within and/or over the workpiece 102, not shown. The workpiece 102 may comprise silicon oxide over single-crystal silicon, for example. The workpiece 102 may include other conductive layers or other semiconductor elements, e.g., transistors, diodes, etc., not shown. Compound semiconductors, GaAs, InP, Si/Ge, or SiC, as examples, may be used in place of silicon. The workpiece 102 may comprise a silicon-on-insulator (SOI) or a SiGe-on-insulator substrate, as examples.

Figure 2:
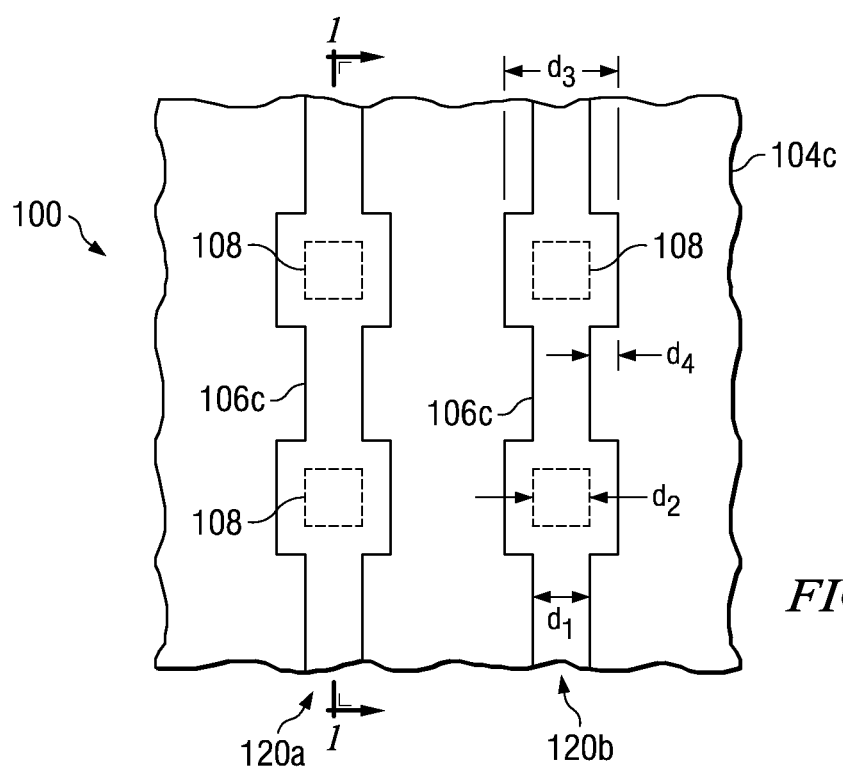
FIG. 2 shows a top view of a capacitor including two of the capacitor plates shown in FIG. 1 that comprise conductive members with enlarged regions proximate at least one via in accordance with an embodiment of the present invention.

At least one via 108 is formed over the workpiece 102, and at least one conductive member 106c or 106a is formed coupled to the at least one via 108, wherein the at least one conductive member 106c or 106a comprises an enlarged region proximate the at least one via 108, as shown in the top view of FIG. 2. A plurality of conductive members 106a or 106c and vias 108 may be included in the capacitor plates 120a and 120b in accordance with embodiments of the present invention.

In some embodiments, conductive members 106c and 106a comprising enlarged regions proximate the vias 108 are formed both over and under the vias 108, as shown in FIG. 1. However, alternatively, vias 108 may be formed within only one conductive material layer $V_1$, and conductive members 106a or 106c may be formed within only one conductive material layer $M_1$ or $M_2$, in other embodiments, forming a capacitor plate 120a or 120b.

To manufacture the embodiment of the invention shown in FIG. 1, a damascene method may be used to form conductive material layer $M_1$. An insulating material 104a comprising a dielectric material is deposited over the workpiece 102. The insulating material 104a is also referred to herein, e.g., in the claims, as a third insulating material 104a, for example. The insulating material 104a may comprise about 1,000 to 4,000 Angstroms, or about 5,000 Angstroms or less, of an oxide such as $SiO_2$, a nitride such as $Si_3N_4$, a high-k dielectric material having a dielectric constant greater than about 3.9, a low-k dielectric material having a dielectric constant less than about 3.9, a capping layer, a hybrid inter-level dielectric (ILD), or combinations and multiple layers thereof, as examples. Alternatively, the insulating material 104a may comprise other dimensions and materials, for example. The insulating material 104a may be formed using chemical vapor deposition (CVD), atomic layer deposition (ALD), metal organic chemical vapor deposition (MOCVD), physical vapor deposition (PVD), a spin-on process, or jet vapor deposition (JVD), as examples, although alternatively, other methods may also be used.

The insulating material 104a is patterned with a pattern for a conductive member 106a, and then a conductive material is formed over the insulating material 104a to fill the pattern and form the conductive member 106a. The conductive member 106a is also referred to herein as a second conductive member or at least one second conductive member, for example. The conductive member 106a may be formed using a single damascene process, for example, wherein the insulating material 104a is patterned using lithography and then portions of the insulating material 104a are then etched away. The conductive material is formed over the insulating material 104a, and excess conductive material is removed from over the top surface of the insulating material 104a using an etch process and/or a chemical-mechanical polish (CMP) process, for example.

Alternatively, the conductive member 106a may be formed using a subtractive etch process, wherein the conductive material is deposited or formed over the workpiece 102, and the conductive material is patterned using lithography in the shape of the conductive member 106a. The insulating material 104a is then formed around the conductive member 106a by depositing the insulating material 104a over the conductive member 106a and removing any excess insulating material 104a from over the top surface of the conductive member 106a, if necessary, for example.

The insulating material 104a and the conductive member 106a may be formed in a conductive material layer or a metallization layer $M_1$ of the semiconductor device 100. Conductive lines, not shown, may be formed elsewhere on the semiconductor device 100 within the metallization layer $M_1$, for example. The conductive lines may be formed simultaneously with the formation of the conductive members 106a of the capacitor plates 120a and 120b, for example. Thus, additional etch processes, lithography processes, and lithography masks may not be required to manufacture the novel conductive member 106a in accordance with embodiments of the present invention. For example, the pattern for the conductive member 106a may be included in an existing mask level for the metallization layer $M_1$. Only one conductive member 106a is shown in FIG. 1; however, in accordance with embodiments of the present invention, a plurality of conductive members 106a may be formed, e.g., simultaneously, in the metallization layer $M_1$.

The conductive material used to form the conductive member 106a may comprise a metal and/or a semiconductive material, for example. The conductive material may comprise copper, aluminum, alloys thereof, polysilicon, amorphous silicon, or combinations or multiple layers thereof, as examples. Alternatively, the conductive material used to form the conductive member 106a may comprise other materials.

Next, vias 108 are formed in a conductive material layer or metallization layer $V_1$ over the metallization layer $M_1$ within an insulating material 104b, as shown in FIG. 1. The vias 108 are also referred to herein as at least one via or at least one first via, for example. The metallization layer $V_1$ is also referred to herein as a first conductive material layer or at least one first conductive material layer, for example. The vias 108 may be formed using a damascene process or using a subtractive etch process, for example, as described for the formation of the conductive members 106a in metallization layer $M_1$.

The vias 108 are disposed over and are coupled to the conductive members 106a, as shown. Insulating material 104b is formed adjacent the insulating material 104a and adjacent portions of the conductive members 106a of conductive material layer $M_1$. The vias 108 may comprise a first end at a lower portion and a second end at a top portion, the second end being opposite the first end, wherein the first ends of the vias 108 are coupled to the conductive members 106a, as shown. The vias 108 may be larger at the second end than at the first end, as shown. Alternatively, in some embodiments, the vias 108 may comprise substantially the same dimension over the entire length, e.g., vertically, of the vias 108, not shown.

The insulating material 104b that the vias 108 are formed in may comprise similar materials and dimensions as described herein for insulating material 104a, for example. The insulating material 104b is also referred to herein as a first insulating material. The vias 108 may comprise similar materials as described herein for the conductive members 106a, for example. Alternatively, the insulating material 104b and the vias 108 may comprise other materials or dimensions.

Conductive vias may be formed elsewhere on the semiconductor device 100 within the metallization layer $V_1$, for example, not shown. The conductive vias may be formed simultaneously with the formation of the vias 108, for example. Thus, additional etch processes, lithography processes and lithography masks may not be required to manufacture the novel vias 108 of the capacitor plates 120a and 120b in accordance with embodiments of the present invention. The pattern for the vias 108 may be included in an existing mask level for the second metallization layer $V_1$, for example.

Only two vias 108 are shown in FIG. 1; however, in accordance with embodiments of the present invention, many, e.g., dozens or hundreds of vias 108 may be formed simultaneously in the metallization layer $V_1$, and may be coupled to the conductive members 106a.

A conductive member 106c is formed in a conductive material layer or metallization layer $M_2$ disposed over the metallization layer $V_1$ within an insulating material 104c, also shown in FIG. 1. The metallization layer $M_2$ is also referred to herein as a second conductive material layer, for example. The conductive member 106c may comprise a plurality of conductive members 106c, as shown in FIG. 2. Only two conductive members 106c are shown in FIG. 2; alternatively, many conductive members 106c, e.g., three or greater, may be formed in parallel. The conductive member 106c is also referred to herein as at least one conductive member or at least one first conductive member, for example. The conductive members 106c may be formed using a damascene process or using a subtractive etch process, for example, as described for the conductive members 106a in the first metallization layer $M_1$.

The conductive members 106c are disposed over and are coupled to the vias 108, as shown in the cross-sectional view in FIG. 1 and in the top view of FIG. 2. The conductive members 106c may be coupled to the second end or upper ends of the vias 108, for example. The conductive members 106c comprise an enlarged region proximate each via 108, as shown in the top view of FIG. 2. The enlarged region of the conductive members 106c is wider than the vias 108 in the top view of the semiconductor device 100. Other regions of the conductive members 106c are not enlarged. The conductive members 106c may be coupled to the vias 108 in a substantially central region of the enlarged regions of the conductive members 106c, as shown.

The conductive members 106a also comprise an enlarged region proximate each via 108, not shown. The conductive members 106a may comprise substantially the same shape as the conductive members 106c shown in the top view of FIG. 2, for example.

FIG. 2 shows a top view of a capacitor including two capacitor plates 120a and 120b that comprise conductive members 106c (and also optionally conductive members 106a, not shown) having enlarged regions proximate vias 108 in accordance with an embodiment of the present invention. The conductive members 106c are shown in the top view of FIG. 2; however, the conductive members 106a are not shown in FIG. 2 (refer again to FIG. 1), for example. The vias 108 are shown in phantom in FIG. 2.

The conductive members 106a and 106c may comprise a width or dimension $d_1$ in regions that are not proximate the vias 108, and the vias 108 may comprise a width or dimension $d_2$, wherein dimension $d_2$ is substantially the same as dimension $d_1$ at least at a top portion of the vias 108. Dimensions $d_1$ and $d_2$ may comprise a minimum feature size or CD of the semiconductor device 100, although alternatively, dimensions $d_1$ and $d_2$ may comprise other dimensions greater than the CD. The width of the enlarged regions of the conductive members 106a and 106c comprises a dimension $d_3$ that is greater than dimensions $d_1$ and $d_2$. Adjacent conductive members 106a and 106c within a conductive material layer $M_1$ or $M_2$ may also be spaced apart from one another by substantially by the minimum feature size of the semiconductor device 100 or by other dimensions, for example.

Dimension $d_3$ is also referred to herein as a first width, and dimension $d_2$ is also referred to as a second width, wherein the first width $d_3$ is greater than the second width $d_2$. The first width $d_3$ may be greater than the second width $d_2$ by about 20% or less of the second width in some embodiments, for example, although alternatively, the first width $d_3$ may be greater than the second width $d_2$ by greater than 20%.

Dimension $d_4$ represents the amount on the sides (e.g., the left and right sides and also portions of the top and bottom sides, shown in FIG. 2) of the vias 108 that the width of the enlarged region is greater than the width $d_2$ of the vias 108 and the thinner, non-enlarged regions of the conductive members 106a and 106c having dimension $d_1$. Dimension $d_4$ may comprise about 10% or less than the width $d_2$ of the vias 108 or the width $d_1$ of the non-enlarged regions of the conductive members 106a or 106c, for example, although alternatively, dimension $d_4$ may comprise greater than 10% of dimensions $d_1$ and/or $d_2$. Regions other than the enlarged regions of the conductive members 106a or 106c may have a dimension $d_1$ that may comprise a width comprising substantially the minimum feature size, in some embodiments.

The insulating material 104c may comprise similar materials and dimensions as described for insulating material 104a, for example. Insulating material 104c is also referred to herein as a second insulating material. The second insulating material 104c is disposed adjacent the first insulating material 104b, as shown. The conductive members 106c may comprise similar materials as described for the conductive members 106a, for example. Alternatively, the second insulating material 104c and the conductive members 106c may comprise other materials or dimensions.

Conductive lines may be formed elsewhere on the semiconductor device 100 within the metallization layer $M_2$, for example, not shown. The conductive lines may be formed simultaneously with the formation of the conductive members 106c of the capacitor plates 120a and 120b, for example. Thus, additional etch processes, lithography processes, and lithography masks may not be required to manufacture the novel conductive members 106c in accordance with embodiments of the present invention; rather, the conductive member 106c pattern may be included in an existing mask level for the metallization layer $M_2$, for example.

Only one conductive member 106c is shown in FIG. 1; however, in accordance with embodiments of the present invention, a plurality of conductive members 106c are formed, e.g., simultaneously, in the metallization layer $M_2$ (see FIG. 2).

In some embodiments, the conductive members 106c and the vias 108 may be simultaneously formed using a dual damascene process. For example, the first insulating material 104b and the second insulating material 104c may be deposited over the workpiece 102, e.g., over the conductive material layer $M_1$, if present, and two lithography masks and etch processes may be used to form patterns in the first insulating material 104b and the second insulating material 104c for the vias 108 and the conductive members 106c, respectively, for example. The patterns for the vias 108 and the conductive members 106c are then simultaneously filled with a conductive material using one deposition step, and excess conductive material is removed using an etch process and/or CMP process, leaving the vias 108 and the conductive members 106c formed within the insulating materials 104b and 104c, respectively.

The metallization or conductive material layers $M_1$, $V_1$, and $M_2$ may comprise conductive material layers $M_x$, $V_x$, and/or $M_{(x+1)}$ disposed at various locations of a semiconductor device 100. For example, layer $M_1$ may comprise a first metallization layer, e.g., the first layer formed in a back-end-of the line (BEOL) process. Or, layer $M_1$ may comprise a second or greater metallization layer, disposed above and over previously formed metallization layers. Alternatively, layers $M_1$, $V_1$, and $M_2$ may comprise conductive material layers formed in a front-end-of the line (FEOL) process, for example.

Capacitor plates 120a and 120b are shown in FIGS. 1 and 2 being formed in three conductive material layers $M_1$, $V_1$, and $M_2$. Alternatively, the capacitor plates 120a and 120b may also be formed in greater than three conductive material layers $M_1$, $V_1$, and $M_2$, e.g., disposed under conductive material layer $M_1$ or over conductive material layer $M_2$. The capacitor plates 120a and 120b may comprise a plurality of alternating layers of conductive members 106a or 106c and vias 108 coupled together to form conductive capacitor plates 120a and 120b, for example.

The conductive members 106a, vias 108, and conductive members 106c form capacitor plates 120a and 120b of a capacitor in accordance with embodiments of the present invention. Two capacitor plates 120a and 120b may be formed proximate one another within the insulating materials 104a, 104b, and 104c, forming a capacitor, in accordance with embodiments of the present invention. Portions of the insulating materials 104a, 104b, and 104c between the plates 120a and 120b function as a capacitor dielectric in these embodiments. Two or more capacitor plates 120a and/or 120b may be coupled together to form a single capacitor plate, to be described further herein.

The conductive members 106a or the conductive members 106c may comprise similar sizes and dimensions as other conductive features formed in the same conductive material layer, for example, in these embodiments. The thinner, non-enlarged regions of conductive members 106a and 106c comprising a width $d_1$ may comprise substantially the same dimension as conductive lines formed elsewhere in conductive material layers $M_1$ and $M_2$, for example.

The conductive members 106a and the conductive members 106c may comprise the same shape and dimension for a single capacitor plate 120a or 120b, for example. Alternatively, the conductive members 106a and the conductive members 106c may comprise different shapes and dimensions for a single capacitor plate 120a or 120b, for example. The conductive members 106a and the conductive members 106c may comprise the same or different shapes and dimensions for various capacitor plates 120a or 120b of a single capacitor or across the surface of a semiconductor device 100, for example.

The conductive members 106a and 106c may extend (e.g., vertically, in the top view shown in FIG. 2) several nm to several or hundreds of μm or greater, for example. A plurality of the vias 108 are disposed along the length of the conductive members 106a and 106c.

In the embodiment shown in FIG. 2, the plurality of vias 108 of the first capacitor plate 120a is disposed proximate the plurality of vias 108 of the second capacitor plate 120b. One via 108 of the first plate 120a is disposed proximate or adjacent, e.g., aligned on an x axis in the view shown in FIG. 2 with a via 108 of the second plate 120b. The vias 108 of adjacent plates 120a and 120b may alternatively be staggered, in accordance with embodiments of the present invention.

Figure 3:
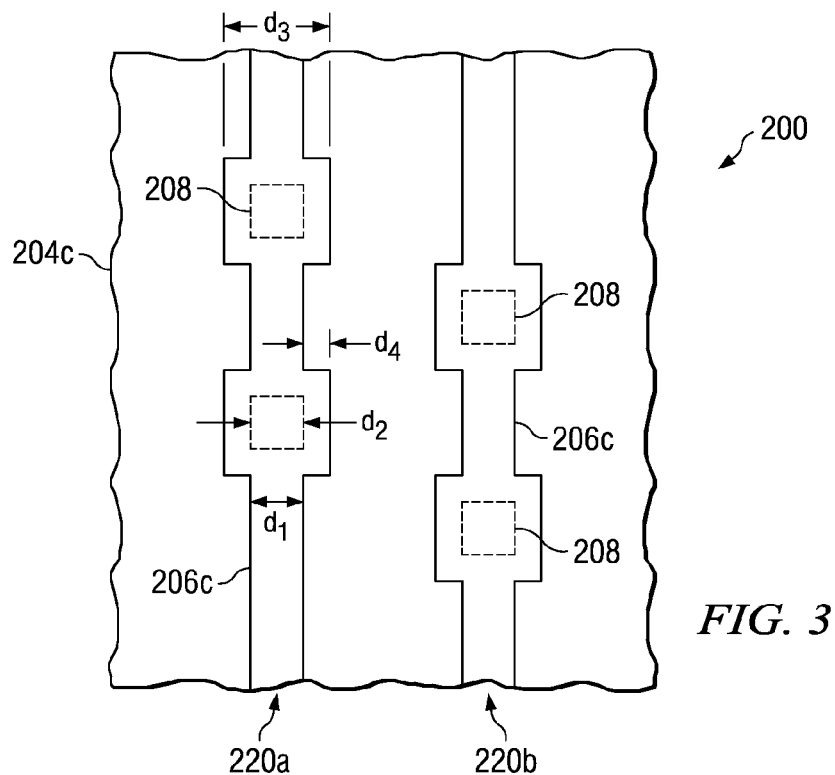
FIG. 3 shows a top view of a capacitor comprising two capacitor plates in accordance with another embodiment of the present invention, wherein the vias of the capacitor plates are staggered.

As an example, FIG. 3 shows a top view of a capacitor comprising two capacitor plates 220a and 220b in accordance with another embodiment of the present invention, wherein the vias 208 of the capacitor plates 220a and 220b are staggered. Like numerals are used for the various elements in FIG. 3 that were used to describe FIGS. 1 and 2. To avoid repetition, each reference number shown in FIG. 3 is not described again in detail herein. Rather, similar materials x06, x08, x10, etc. . . . are used to describe the various material layers shown as were used to describe FIGS. 1 and 2, where x=1 in FIGS. 1 and 2 and x=2 in FIG. 3. As an example, the exemplary and alternative materials and dimensions described for the conductive members 106c in the description for FIGS. 1 and 2 may also be used for the conductive members 206c shown in FIG. 3.

Rather than the vias 208 being aligned in adjacent capacitor plates 220a and 220b as shown in the embodiment of FIGS. 1 and 2, vias 208 in adjacent plates 220a and 220b are staggered. The vias 208 of the first plate 220a are staggered with respect to the vias 208 of the second plate 220a. For example, in FIG. 3, vias 208 of capacitor plate 202a are disposed adjacent or proximate the thinner, non-enlarged regions of conductive members 206c of capacitor plate 220b having dimension $d_1$ Likewise, vias 208 of capacitor plate 220b are disposed adjacent or proximate the thinner, non-enlarged regions of conductive members 206c of capacitor plate 220a having dimension $d_1$. The enlarged regions of the conductive members 206c proximate vias 208 in the adjacent plates 220b and 220a are also placed proximate the thinner, non-enlarged regions of conductive members 206c of the adjacent capacitor plates 220a and 220b, respectively, for example. Thus, the capacitor plates 220a and 220b may be placed closer together in this embodiment, due to the staggered formation of the vias 208 and the enlarged regions of the conductive members 206c, providing increased capacitance.

Figure 4:
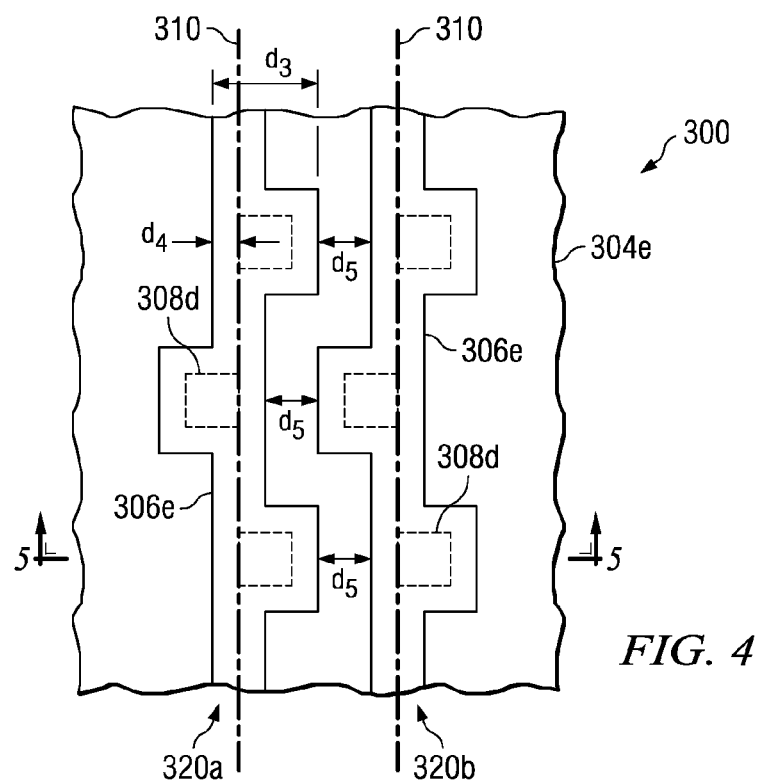
FIG. 4 shows a top view of a capacitor comprising two capacitor plates in accordance with yet another embodiment of the present invention, wherein the vias of the capacitor plates are alternatingly staggered about a central axis of the conductive members.
Figure 5:
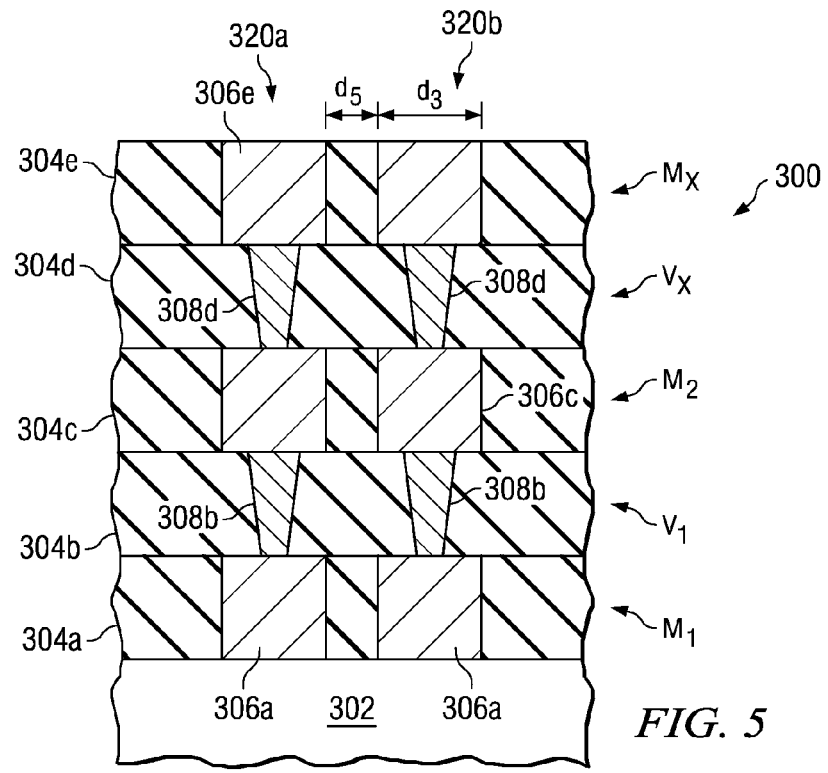
FIG. 5 shows a cross-sectional view of the capacitor plates shown in FIG. 4, wherein the capacitor plates are formed in a plurality of conductive material layers of a semiconductor device.
Figure 6:
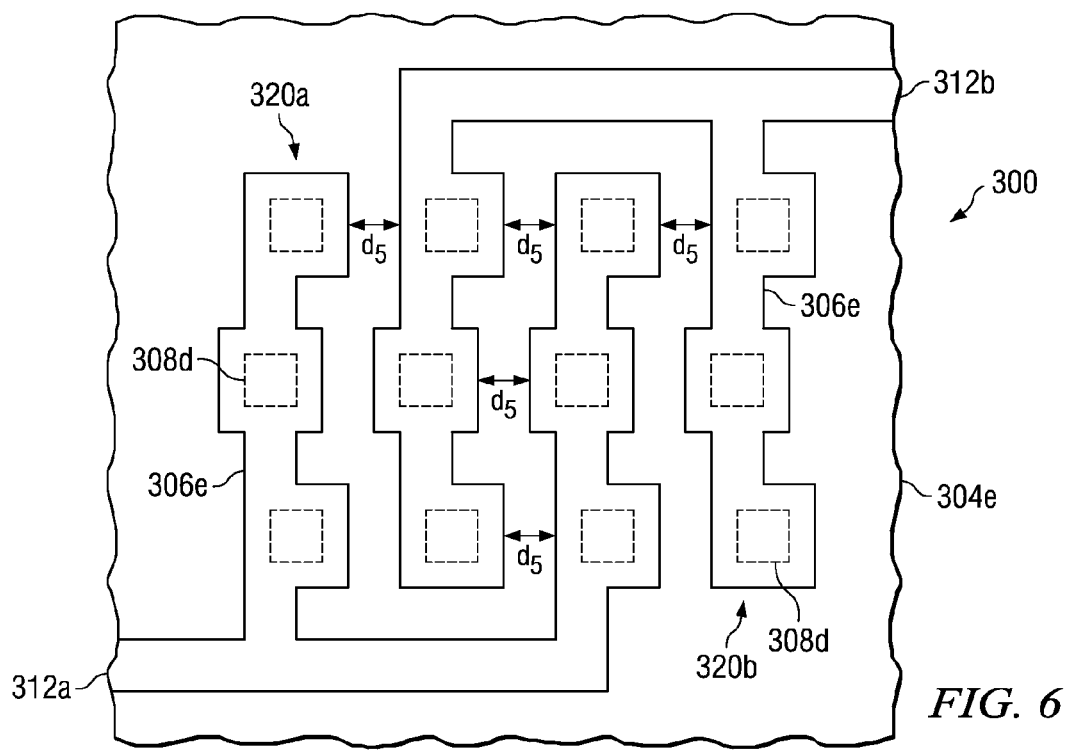
FIG. 6 shows a top view of another embodiment of the present invention, wherein two or more capacitor plates are electrically coupled together in a conductive material layer of the semiconductor device.
Figure 7:
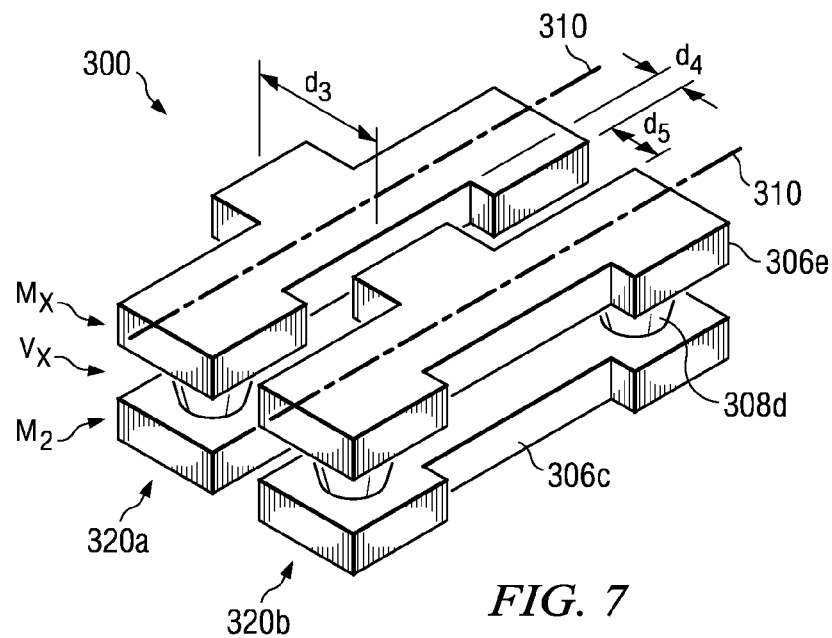
FIG. 7 shows a perspective view of an embodiment of the present invention, illustrating the enlarged regions of the conductive members proximate the vias.

The vias 308b or 308d within a single capacitor plate 320a or 320b may also be staggered. For example, FIG. 4 shows a top view of a capacitor comprising two capacitor plates 320a and 320b in accordance with yet another embodiment of the present invention, wherein the vias 308 of the capacitor plates 320a and 320b are alternatingly staggered about a central axis 310 of the conductive members 306e. FIG. 5 shows a cross-sectional view of the capacitor plates 320a and 320b shown in FIG. 4, wherein the capacitor plates 320a and 320b are formed in a plurality of conductive material layers $M_1$, $V_1$, $M_2$, $V_x$, and $M_x$ of the semiconductor device 300. FIG. 6 shows a view wherein two or more capacitor plates 320a and 320b are connected by conductive lines, and FIG. 7 shows a perspective view of the embodiment shown in FIG. 4 implemented in three conductive material layers of the semiconductor device 300. Again, like numerals are used for the various elements that were used to describe the previous figures, and to avoid repetition, each reference number shown in FIG. 4 is not described again in detail herein.

Referring next to FIGS. 4 and 5, vias 308b and 308d comprise similar materials and dimensions and are formed by similar methods, as were described for vias 108 of FIGS. 1 and 2. Vias 308b and 308d are formed in conductive material layers $V_1$ and $V_x$, respectively, which are disposed between conductive material layers $M_1$, $M_2$, and $M_x$. Conductive members 306e having enlarged regions proximate vias 308d are formed over vias 308d in conductive material layer $M_x$. Conductive members 306e comprise similar materials and dimensions and are formed by similar methods as were described for conductive members 106a and 106c of FIGS. 1 and 2. The capacitor plates 320a and 320b may also include additional vias 308x and conductive members 306x (not shown) formed in additional conductive material layers V(x+1) and M(x+1) of the semiconductor device 300 (also not shown), for example.

The central axis 310 shown in FIG. 4 is disposed in a central region of the conductive members 306e (and also conductive members 306a and 306c, not shown). More particularly, for example, the central axis 310 is disposed in the center of the thinner, non-enlarged regions of the conductive members 306a, 306c, and 306e. One edge of the vias 308d (and also vias 308b) is disposed along the central axis 310 and the other edge of the vias 308d is disposed alternatingly to the right and to the left of the central axis 310.

For example, in the top view of FIG. 4, the top via 308d of capacitor plate 320a has a left edge that is aligned with and adjacent to the central axis 310 of the capacitor plate 320a. The right edge of the top via 308d is disposed to the right of the central axis 310. The enlarged region of the conductive members 306a, 306c, and 306e proximate the top via 308d extends towards the right to cover the vias 308d completely, and by an excessive amount having dimension $d_4$. Likewise, the middle via 308d of capacitor plate 320a has a right edge that is aligned with and adjacent to the central axis 310 of the capacitor plate 320a. The left edge of the middle via 308d is disposed to the left of the central axis 310. The enlarged region of the conductive members 306a, 306c, and 306e proximate the middle via 308d extends towards the left to cover the middle via 308d completely and by an excess amount, dimension $d_4$. The remainder of the vias 308d of the capacitor plates 320a and 320b are placed in a similar, array-like fashion. The conductive members 306e and vias 308d are positioned in a serpentine-like, meandering shape in this embodiment. In some embodiments, the vias may be offset from the central axis 310 and not aligned with or adjacent to the central axis 310, as shown in FIG. 6, to be described further herein.

The capacitor plates 320a and 320b may advantageously be placed apart by substantially the same distance or dimension $d_5$ along their entire length. The conductive members 306e (and also 306a and 306c) of the first capacitor plate 320a and the conductive members 306a, 306c, and 306e of the second capacitor plate 320b may be spaced apart by substantially the same distance comprising dimension $d_5$ along an entire length of the conductive members 306a, 306c, and 306e of the first capacitor plate 320a and the conductive members 306a, 306c, and 306e of the second capacitor plate 320b, for example. Dimension $d_5$ may comprise a minimum feature size of the semiconductor device 300, or alternatively, dimension $d_5$ may comprise other values, e.g., being larger or smaller than the minimum feature size or CD.

FIG. 6 shows a top view of another embodiment of the present invention, wherein two or more capacitor plates 320a or 320b are electrically coupled together. In FIG. 6, for example, four capacitor plates are shown: two first plates 320a that are coupled together by a conductive line 312a, and two second plates 320b that are coupled together by a conductive line 312b. The two first plates 320a and the two second plates 320b are coupled together in parallel by the conductive lines 312a and 312b, respectively. Connecting a plurality of plates 320a and 320b together in parallel as shown in an interwoven or interleaved pattern may result in a capacitor with increased capacitance, for example.

The two or more capacitor plates 320a or 320b may be coupled together by conductive line 312a or 312b formed in the same conductive material layer that conductive members 306e (or 306a or 306c) are formed in or in the conductive material layers that the vias 308b and 308d are formed in, for example. The two or more capacitor plates 320a or 320b may also be coupled together by conductive lines formed in a conductive material layer adjacent or proximate the conductive material layers that the conductive members 306a, 306c, and 306e, or vias 308b and 308d are formed in, for example, not shown.

A plurality of the other capacitor plates 120a, 120b, 220a, and 220b described herein and 420, 420b, 420c, and 420d to be described herein may also be similarly coupled together in parallel by conductive lines 312a or 312b, for example, not shown.

In the embodiment shown in FIG. 6, the vias 308d within a single capacitor plate 320a or 320b are staggered, e.g., in the vertical direction. The vias 308d are offset from the central axis 310 and are not aligned with or adjacent to a central axis of the conductive members 306e. Rather, each via 308d is staggered by about 20% or less alternatingly to the right and left of the conductive members 306e. The enlarged regions of the conductive members 306e are also staggered by about 20% or less alternatingly to the right and left of the conductive members 306e, as shown. The capacitor plates 320a and 320b may also include a plurality of alternating layers of vias 308e and conductive members 306e comprising the staggered structure shown in FIG. 6, for example.

FIG. 7 shows a perspective view of the embodiment of the present invention shown in FIGS. 4 and 5, formed in three conductive material layers $M_2$, $V_x$, and $M_x$, illustrating the enlarged regions of the conductive members 306e and 306c proximate the vias 308d. The novel enlarged regions of the conductive members 306c and 306e having a wider dimension $d_3$ than the via 308d width ensure the landing of the vias 308d with other portions of the capacitor plates 320a and 320b, e.g., the landing of the vias 308d on the enlarged regions of underlying conductive members 306c, and also the landing of the conductive members 306e on the underlying vias 308d.

Figure 8:
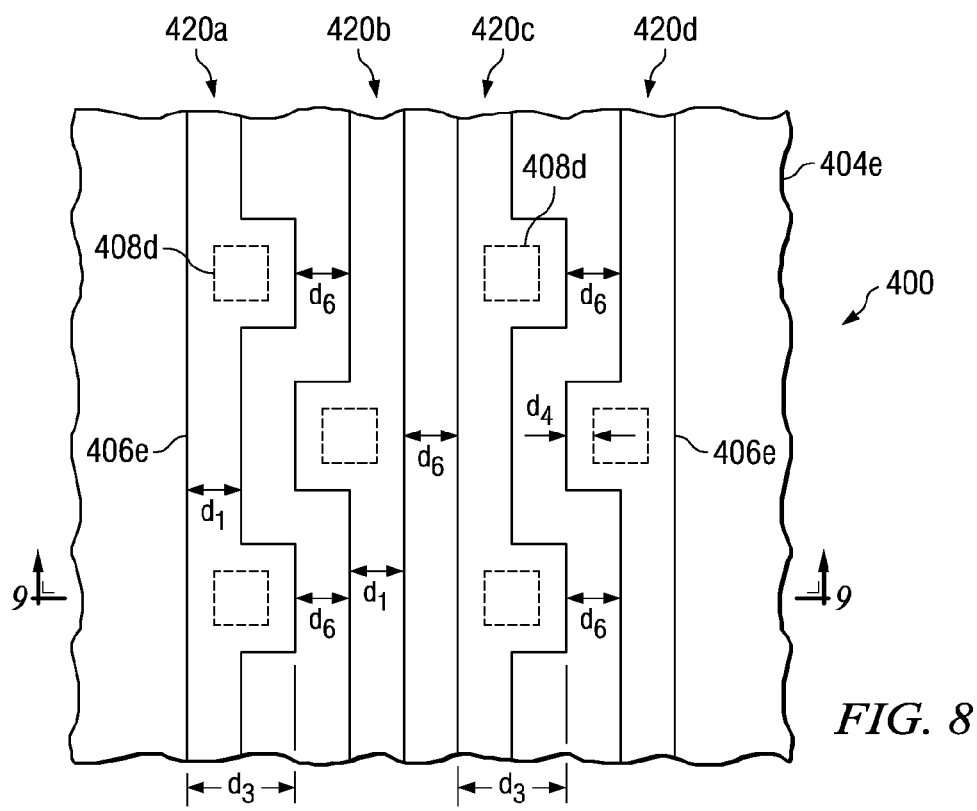
FIG. 8 shows a top view of yet another embodiment of the present invention, wherein vias of adjacent capacitor plates are staggered and wherein the enlarged regions extend towards an adjacent capacitor plate.
Figure 9:
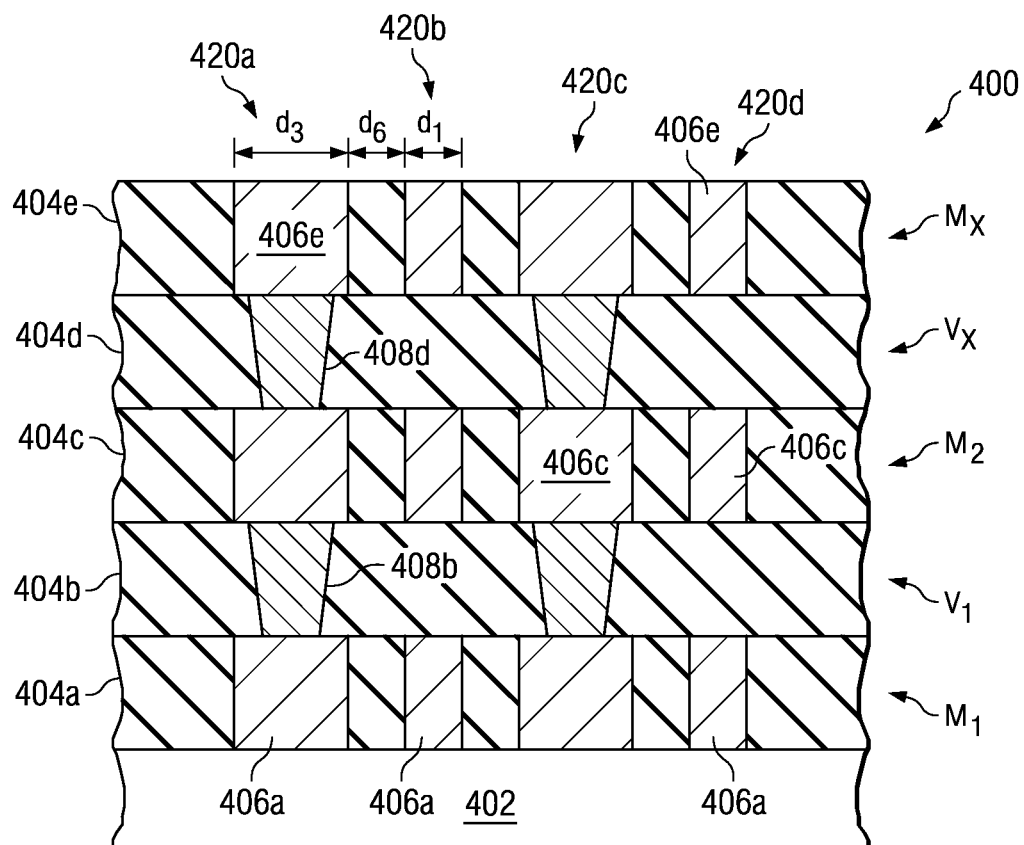
FIG. 9 shows a cross-sectional view of the semiconductor device shown in FIG. 8.

FIG. 8 shows yet another embodiment of the present invention, wherein vias 408d (and also vias 408b) of adjacent capacitor plates 420a and 420b, and 420c and 420d, are staggered, and wherein the enlarged regions of the conductive members 406e (and also conductive members 406a and 406c) extend towards an adjacent capacitor plate. FIG. 9 shows a cross-sectional view of the semiconductor device 400 shown in FIG. 8. Again, like numerals are used for the various elements that were used to describe the previous figures, and to avoid repetition, each reference number shown in FIGS. 8 and 9 is not described again in detail herein.

As described with reference to the embodiment shown in FIG. 3, the plurality of vias 408b and 408d of the first plate 420a are staggered with respect to the plurality of vias 408b and 408d of the second plate 420b. Similarly, the plurality of vias 408b and 408d of first plate 420c are staggered with respect to the plurality of vias 408b and 408d of second plate 420d.

The enlarged regions of the conductive members 406a, 406c, and 406e are disposed so that they extend towards only one adjacent capacitor plate 420a, 420b, 420c, or 420d. One side of the conductive members 406a, 406c, and 406e is substantially straight. For example, the enlarged regions of the conductive members 406a, 406c, and 406e of capacitor plate 420a extend to the right towards capacitor plate 420b, and the enlarged regions of the conductive members 406a, 406c, and 406e of capacitor plate 420b extend to the left towards capacitor plate 420a. The left side of capacitor plate 420a is substantially straight, and the right side of capacitor plate 420b is substantially straight. Likewise, the enlarged regions of the conductive members 406a, 406c, and 406e of capacitor plate 420c extend towards capacitor plate 420d, and the enlarged regions of the conductive members 406a, 406c, and 406e of capacitor plate 420d extend towards capacitor plate 420c. The left side of capacitor plate 420c is substantially straight, and the right side of capacitor plate 420d is substantially straight.

By positioning the vias 408b and 408d and enlarged regions of the conductive members 406a, 406c, and 406e as shown in FIGS. 8 and 9, advantageously, the capacitor plates 420a and 420b, and 420c and 420d, may be spaced apart by substantially the same distance or dimension $d_6$ along the entire length of the capacitor plates 420a, 420b, 420c, and 420d. Dimension $d_6$ may comprise a minimum feature size of the semiconductor device 400, or alternatively, dimension $d_6$ may comprise other values, e.g., being larger or smaller than the minimum feature size.

Note that first plates 420a and 420c and second plates 420b and 420d may also be coupled together by conductive lines such as conductive lines 312a and 312b shown in FIG. 6, not shown in the figures.

In some embodiments, an array of capacitor plates 420a, 420b, 420c, and/or 420d comprising the conductive members 406a, 406c, and/or 406e having enlarged regions proximate vias 408b and/or 408d may be formed across a portion of a semiconductor workpiece 402, for example. The vias 408b and/or 408d and the enlarged regions of the conductive members 406a, 406c, and/or 406e may be staggered, and the capacitor plates 420a, 420b, 420c, and/or 420d may be interwoven or interleaved. The capacitor plates 420a, 420b, 420c, and/or 420d may be spaced apart to achieve a desired capacitance and to achieve a more efficient use of space on a chip or semiconductor device 400, for example.

After the top-most material layer comprising the vias 108, 208, 308b, 308d, 408b, or 408d or conductive members 106a, 106c, 206a, 206c, 306a, 306c, 306e, 406a, 406c, or 406e of the capacitor plates 120a, 120b, 220a, 220b, 320a, 320c, 420a, 420b, 420c, and/or 420d is fabricated, the manufacturing process for the semiconductor devices 100, 200, 300, and 400 is then continued to complete the fabrication of the semiconductor devices 100, 200, 300, and 400. For example, additional insulating material layers and conductive material layers may be formed over the novel capacitor plates 120a, 120b, 220a, 220b, 320a, 320c, 420a, 420b, 420c, and/or 420d and may be used to interconnect the various components of the semiconductor devices 100, 200, 300, and 400.

Embodiments of the present invention include the novel capacitor plates 120a, 120b, 220a, 220b, 320a, 320c, 420a, 420b, 420c, and/or 420d, capacitors including the capacitor plates 120a, 120b, 220a, 220b, 320a, 320c, 420a, 420b, 420c, and/or 420d, and semiconductor devices 100, 200, 300, and 400 including the novel capacitor plates 120a, 120b, 220a, 220b, 320a, 320c, 420a, 420b, 420c, and/or 420d described herein. Embodiments of the present invention also include methods of fabricating the semiconductor devices 100, 200, 300, and 400 and capacitor plates 120a, 120b, 220a, 220b, 320a, 320c, 420a, 420b, 420c, and/or 420d described herein, for example.

The novel capacitor plates 120a, 120b, 220a, 220b, 320a, 320c, 420a, 420b, 420c, and/or 420d comprise three-dimensional structures that are formed in multiple conductive material layers $M_1$, $V_1$, $M_2$, $V_x$, and $M_x$ of a semiconductor device 100, 200, 300, and 400. The conductive members 106a, 106c, 206a, 206c, 306a, 306c, 306e, 406a, 406c, or 406e coupled to vias 108, 208, 308b, 308d, 408b, or 408d provide a novel capacitor plate 120a, 120b, 220a, 220b, 320a, 320c, 420a, 420b, 420c, and/or 420d shape that provides flexibility in the placement and shaping of capacitors of semiconductor devices 100, 200, 300, and 400. In some embodiments, portions of the capacitor plates 120a, 120b, 220a, 220b, 320a, 320c, 420a, 420b, 420c, and/or 420d and the spacing between them may be ground-rule based, comprising a width of a minimum feature size of a semiconductor device 100, 200, 300, and 400, achieving a higher capacitance value, for example.

The capacitor plates 120a, 120b, 220a, 220b, 320a, 320c, 420a, 420b, 420c, and/or 420d described herein may be placed in series or in parallel. For example, placing the capacitor plates 120a, 120b, 220a, 220b, 320a, 320c, 420a, 420b, 420c, and/or 420d in series reduces the overall capacitance of the capacitors comprised of the capacitor plates 120a, 120b, 220a, 220b, 320a, 320c, 420a, 420b, 420c, and/or 420d. Placing the capacitor plates 120a, 120b, 220a, 220b, 320a, 320c, 420a, 420b, 420c, and/or 420d in parallel increases the overall capacitance of the capacitors comprised of the capacitor plates 120a, 120b, 220a, 220b, 320a, 320c, 420a, 420b, 420c, and/or 420d.

The capacitor plates 120a, 120b, 220a, 220b, 320a, 320c, 420a, 420b, 420c, and/or 420d may include additional vias 108, 208, 308b, 308d, 408b, or 408d and conductive members 106a, 106c, 206a, 206c, 306a, 306c, 306e, 406a, 406c, or 406e coupled to and disposed above and/or below the conductive members 106a, 106c, 206a, 206c, 306a, 306e, 406a, or 406e, not shown. The vias 108, 208, 308b, 308d, 408b, and 408d and conductive members 106a, 106c, 206a, 206c, 306a, 306c, 306e, 406a, 406c, and 406e may be formed in multiple conductive material layers $M_1$, $V_1$, $M_2$, $V_x$, and $M_x$, or in every conductive material layer $M_1$, $V_1$, $M_2$, $V_x$, and $M_x$, of a semiconductor device 100, 200, 300, and 400, for example.

The dimensions and materials of the vias 108, 208, 308b, 308d, 408b, and 408d and conductive members 106a, 106c, 206a, 206c, 306a, 306c, 306e, 406a, 406c, and 406e, the type of dielectric material (e.g., of insulating materials 104a, 104b, 104c, 204a, 304a, 304b, 304c, 304d, 304e, 404a, 404b, 404c, 404d, and 404e), and the spacing (e.g., such as dimensions $d_5$ or $d_6$) between the capacitor plates 120a, 120b, 220a, 220b, 320a, 320c, 420a, 420b, 420c, and/or 420d may be selected to achieve a desired capacitance for a capacitor, for example.

Advantages of embodiments of the present invention include providing novel capacitor plate 120a, 120b, 220a, 220b, 320a, 320c, 420a, 420b, 420c, and/or 420d structures and novel capacitors for semiconductor devices 100, 200, 300, and 400. A plurality of the capacitors may be arranged in an array or other shapes, and may be accessed using addressing, for example. The capacitors may be electrically connected to functional regions of the semiconductor device 100, 200, 300, or 400 and/or may be used as spare capacitors, providing redundancy in an integrated circuit, for example.

In some embodiments, at least portions of the vias 108, 208, 308b, 308d, 408b, and 408d and/or conductive members 106a, 106c, 206a, 206c, 306a, 306c, 306e, 406a, 406c, and 406e may have substantially the same or similar dimensions as other interconnect features or devices such as conductive lines and vias formed elsewhere in the conductive material layers $M_1$, $V_1$, $M_2$, $V_x$, and $M_x$ of the semiconductor devices 100, 200, 300, and 400, so that capacitors formed from the novel capacitor plates 120a, 120b, 220a, 220b, 320a, 320c, 420a, 420b, 420c, and/or 420d are easily integratable into existing semiconductor device 100, 200, 300, and 400 structures and manufacturing process flows.

The locally enlarged landing areas, e.g., the enlarged regions of the conductive members 106a, 106c, 206a, 206c, 306a, 306c, 306e, 406a, 406c, and 406e, provide for landing and formation on vias 108, 208, 308b, 308d, 408b, and 408d at the bottom and top regions of the vias of about 1.3× to 2.0× the ground rule value in some embodiments. The capacitor plates 120a, 120b, 220a, 220b, 320a, 320c, 420a, 420b, 420c, and/or 420d may be symmetrically formed, which provides consistent repetitive manufacturing processes for connecting to vias 108, 208, 308b, 308d, 408b, and 408d, and which also provides design convenience.

The capacitors formed from the novel capacitor plates 120a, 120b, 220a, 220b, 320a, 320c, 420a, 420b, 420c, and/or 420d are small, fast, and low in complexity and cost. The properties of the capacitors may be tuned by adjusting the capacitor dielectric thickness and materials, and by array arrangement of the capacitor plates 120a, 120b, 220a, 220b, 320a, 320c, 420a, 420b, 420c, and/or 420d, as examples.

The capacitor plate 120a, 120b, 220a, 220b, 320a, 320c, 420a, 420b, 420c, and/or 420d designs described herein provide rugged shapes that increase via top CD area and overlay margin by providing a modified landing area that is larger locally, proximate the vias 108, 208, 308b, 308d, 408b, and 408d, e.g., at the enlarged regions of the conductive members 106a, 106c, 206a, 206c, 306a, 306c, 306e, 406a, 406c, and 406e. A larger amount of capacitance, e.g., about 20% or greater in some designs, is achievable in capacitors by the use of the capacitors plates 120a, 120b, 220a, 220b, 320a, 320c, 420a, 420b, 420c, and/or 420d described herein, without degradation of the manufacturing process flow or device yields.

Capacitors formed from the capacitor plates 120a, 120b, 220a, 220b, 320a, 320c, 420a, 420b, 420c, and/or 420d may comprise vertical natural capacitors having a ground rule-based design that are cost and area-efficient, requiring no additional lithography masks to manufacture. Capacitors having improved TDDB are achievable by embodiments of the present invention. The novel capacitor plate 120a, 120b, 220a, 220b, 320a, 320c, 420a, 420b, 420c, and/or 420d shapes allow the placement of the capacitor plates 120a, 120b, 220a, 220b, 320a, 320c, 420a, 420b, 420c, and/or 420d closer together, increasing the capacitance of capacitors formed from the plates 120a, 120b, 220a, 220b, 320a, 320c, 420a, 420b, 420c, and/or 420d.

The vias 108, 208, 308b, 308d, 408b, and 408d may be staggered or non-staggered, which is advantageous in applications where the vias 108, 208, 308b, 308d, 408b, and 408d may be positioned neighboring or disposed between different ground rule levels, such as proximate thin wiring (having a minimum feature size), 2× wiring (having 2× the minimum feature size), and/or 4× wiring (with 4× the minimum feature size), for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a capacitor, the method comprising:

forming at least one first conductive material layer over a workpiece, the at least one first conductive material layer including a first insulating material and at least one via disposed within the first insulating material; and forming at least one second conductive material layer adjacent the at least one first conductive material layer, the at least one second conductive material layer including a second insulating material and at least one conductive member disposed within the second insulating material, the at least one conductive member being coupled to the at least one via, wherein forming the at least one second conductive material layer comprises forming at least one conductive member comprising an enlarged region proximate the at least one via, and wherein forming the at least one first conductive material layer and forming the at least one second conductive material layer comprise forming an at least one conductive member and at least one via that comprise at least one capacitor plate.

2. The method according to claim 1, wherein forming the at least one second conductive material layer comprises forming the at least one conductive member wherein the enlarged region of the at least one conductive member is wider than the at least one via in a top view of the capacitor.

3. The method according to claim 2, wherein forming the at least one second conductive material layer comprises forming the at least one conductive member wherein the enlarged region of the at least one conductive member extends towards an adjacent capacitor plate.

4. The method according to claim 1, wherein at least one of forming the first conductive material layer and forming the second conductive material layer comprises a single damascene process or a dual damascene process.

5. The method according to claim 1, wherein at least one of forming the first conductive material layer and forming the second conductive material layer comprises a subtractive etch process.

6. The method according to claim 1, wherein forming the first conductive material layer comprises forming a first metallization layer, and wherein forming the second conductive material layer comprises forming a second metallization layer.

7. A method for manufacturing a capacitor plate, the method comprising:
forming a first via and a second via over a workpiece; and
forming a first conductive member coupled to the first via and the second via, wherein the first conductive member comprises a first region proximate the first via having a first region width, a second region proximate the second via having a second region width, and a third region between the first region and the second region having a third region width, wherein the first via comprises a first via width and wherein the second via comprises a second via width, wherein the first region width is greater than the first via width and the second region width is greater than the second via width, and wherein the third region width is smaller than the first region width and the second region width.

8. The method according to claim 7, further comprising forming a first insulating layer over the workpiece and wherein forming the first via and the second via comprises disposing the first via and the second via within the first insulating layer.

9. The method according to claim 8, further comprising forming a second insulating layer over the first insulating layer, wherein forming the first conductive member comprises disposing the first conductive member within the second insulating layer, and wherein the second insulating layer is adjacent the first insulating layer.

10. The method according to claim 9, further comprising forming a third insulating layer prior to forming the first insulating layer and disposing a second conductive member within the third insulating layer so that the second conductive member is coupled to the first via and the second via.

11. The method according to claim 10, wherein the second conductive member comprises a fourth region proximate the first via having a fourth region width, a fifth region proximate the second via having a fifth region width, and a six region between the fourth region and the fifth region having a sixth region width, wherein the first via comprises a third via width and wherein the second via comprises a fourth via width, wherein the fourth region width is greater than the third via width and the fifth region width is greater than the fourth via width, and wherein the sixth region width is smaller than the fourth region width and the fifth region width.

12. The method according to claim 11, wherein the first region width, the second region width, the fourth region width and the fifth region width are substantially a same and wherein the third region width and the sixth region width are substantially a same.

13. The method according to claim 11, wherein the first via width and the second via width are substantially a same, wherein the third via width and the fourth via width are substantially a same, and wherein the first via width is larger than the third via width.

14. A method for manufacturing a capacitor, the method comprising:
forming a first conductive line having a first line width in a first material layer;
forming a second conductive line having a second line width in the first material layer;
forming a third conductive line having a third line width in a second material layer;
forming a fourth conductive line having a fourth line width in the second material layer; and
forming a plurality of vias in a third material layer, a first number of the vias connecting the first conductive line and the third conductive line, and a second number of the vias connecting the second conductive line and the fourth conductive line,
wherein the first conductive line comprises a first extended line width and the third conductive line comprises a third extended line width in first regions where the first number of the vias connect the first conductive line and the third conductive line, and wherein the second conductive line comprises a second extended line width and the fourth conductive line comprises a fourth extended line width in second regions where the second number of the vias connect the second conductive line and the fourth conductive line.

15. The method according to claim 14, wherein the first regions are aligned with the second regions.

16. The method according to claim 14, wherein the first regions are staggered with respect to the second regions.

17. The method according to claim 14, wherein the first regions are alternatingly staggered, wherein the second regions are alternatingly staggered, wherein a distance between the first conductive line conductive line and the second conductive line is substantially a same, and wherein a distance between the third conductive line and the fourth conductive line is substantially a same.

18. The method according to claim 14, wherein the first line width, the second line width, the third line width and the fourth line width are substantially a same width, and wherein the first extended line width, the second extended line width, the third extended line width and the fourth extended line width are substantially a same width.

19. The method according to claim 14, further comprising forming a fifth conductive line and a sixth conductive line in the first material layer and forming a seventh conductive line and an eighth conducive line in a second material layer, wherein the first conductive line and the third conductive line, and the fifth conductive line and the seventh conductive line form a first capacitor plate, wherein the second conductive line and the fourth conductive line, and the sixth conductive line and eighth conductive line form a second capacitor plate, wherein the second and fourth conductive lines are arranged between the first and third conductive lines and the fifth and seventh conductive lines, and wherein the fifth and seventh conductive lines are arranged between the second and fourth conductive lines and the sixth and eighth conductive lines.

20. The method according to claim 19, wherein the first regions of the first and third conductive lines face the second regions of the second and fourth conductive lines, and wherein third regions of the fifth and seventh conductive lines face fourth regions of the sixth and eighth conductive lines.

* * * * *

UNITED STATES PATENT AND TRADEMARK OFFICE
CERTIFICATE OF CORRECTION

PATENT NO. : 8,748,257 B2  
APPLICATION NO. : 13/100770  
DATED : June 10, 2014  
INVENTOR(S) : Sun-Oo Kim Page 1 of 1

It is certified that error appears in the above-identified patent and that said Letters Patent is hereby corrected as shown below:

In the Claims

In Col. 16, line 46, claim 17, immediately after "between the first" delete "conductive line".

Signed and Sealed this  
Seventh Day of October, 2014

Michelle K. Lee  
*Deputy Director of the United States Patent and Trademark Office*